US010454235B2

(12) United States Patent
Murakami et al.

(10) Patent No.: US 10,454,235 B2
(45) Date of Patent: Oct. 22, 2019

(54) METHOD OF MANUFACTURING COIL COMPONENT

(71) Applicant: MURATA MANUFACTURING CO., LTD., Kyoto-fu (JP)

(72) Inventors: Takashi Murakami, Nagaokakyo (JP); Akio Igarashi, Nagaokakyo (JP); Koji Onishi, Nagaokakyo (JP)

(73) Assignee: Murata Manufacturing Co., Ltd., Kyoto-fu (JP)

(*) Notice: Subject to any disclaimer, the term of this patent is extended or adjusted under 35 U.S.C. 154(b) by 43 days.

(21) Appl. No.: 15/714,375

(22) Filed: Sep. 25, 2017

(65) Prior Publication Data

US 2018/0097327 A1 Apr. 5, 2018

(30) Foreign Application Priority Data

Sep. 30, 2016 (JP) ................................ 2016-192421

(51) Int. Cl.
*H01R 9/00* (2006.01)
*H05K 3/00* (2006.01)
(Continued)

(52) U.S. Cl.
CPC .............. *H01R 43/20* (2013.01); *H01F 5/04* (2013.01); *H01F 17/043* (2013.01); (Continued)

(58) Field of Classification Search
CPC ............... H01R 43/20; H01R 43/0221; H01R 43/0228; H01F 27/292; H01F 17/043; (Continued)

(56) References Cited

U.S. PATENT DOCUMENTS

| | | | | |
|---|---|---|---|---|
| 6,427,315 B1 * | 8/2002 | Kitagawa | H01F 5/04 29/602.1 |
| 7,411,478 B2 * | 8/2008 | Hatakeyama | H01F 17/045 336/192 |
| 2008/0003864 A1 | 1/2008 | Hatakeyama et al. | |

FOREIGN PATENT DOCUMENTS

| | | |
|---|---|---|
| JP | S53-064788 A1 | 6/1978 |
| JP | H10-064747 A1 | 3/1998 |

(Continued)

OTHER PUBLICATIONS

An Office Action; "Notification of Reasons for Refusal," Mailed by the Japanese Patent Office dated Jan. 8, 2019, which corresponds to Japanese Patent Application No. 2016-192421 and is related to U.S. Appl. No. 15/714,375; with English language translation.

*Primary Examiner* — Donghai D Nguyen
(74) *Attorney, Agent, or Firm* — Studebaker & Brackett PC

(57) ABSTRACT

A metal terminal where a connecting portion has a receiving portion which receives a wire and a contact segment which extends from the receiving portion by way of a bending scheduled portion is prepared. By applying heat and pressure in a state where the wire is placed on the receiving portion for temporarily fixing the wire, the wire is adhered to the receiving portion using a molten or softened insulating resin coating as an adhesive agent. Next, the connecting portion is bent by way of the bending scheduled portion such that the contact segment faces the receiving portion by way of the wire and the contact segment is brought into contact with the wire. Next, by irradiating a laser beam to a portion of the metal terminal, the wire and the metal terminal are welded to each other.

6 Claims, 7 Drawing Sheets

(51) Int. Cl.

*H01R 43/20* (2006.01)
*H01R 43/02* (2006.01)
*H01F 5/04* (2006.01)
*H01F 17/04* (2006.01)
*H01F 27/28* (2006.01)
*H01F 27/29* (2006.01)
*H01F 17/00* (2006.01)

(52) U.S. Cl.

CPC ....... *H01F 27/2828* (2013.01); *H01F 27/292* (2013.01); *H01R 43/0221* (2013.01); *H01R 43/0228* (2013.01); *H01F 2017/0093* (2013.01)

(58) Field of Classification Search

CPC ................... H01F 5/04; H01F 27/2828; H01F 2017/0093; Y10T 29/49073; Y10T 29/49149

USPC ........................................... 29/605, 843, 876

See application file for complete search history.

(56) References Cited

FOREIGN PATENT DOCUMENTS

| | | | |
|---|---|---|---|
| JP | 4184394 | B2 | 11/2008 |
| WO | 2015/045955 | A1 | 4/2015 |

* cited by examiner

METHOD OF MANUFACTURING COIL COMPONENT

CROSS REFERENCE TO RELATED APPLICATIONS

This application claims benefit of priority to Japanese Patent Application 2016-192421 filed Sep. 30, 2016, the entire content of which is incorporated herein by reference.

TECHNICAL FIELD

The present disclosure relates to a method of manufacturing a coil component, and more particularly to a method of connecting a wire and a metal terminal to each other.

BACKGROUND

As a technique of interest related to the present disclosure, for example, there has been known a technique described in Japanese patent 4184394. FIG. 9 and FIG. 10 are drawings cited from Japanese patent 4184394, and correspond to FIG. 2 and FIG. 4 in Japanese patent 4184394, respectively. FIG. 9 and FIG. 10 show one flange portion 1 which forms a portion of a core provided to a coil component, a metal terminal 2 disposed on the flange portion 1, and an end portion of a wire 3 connected to the metal terminal 2.

As shown in FIG. 9 and FIG. 10, the wire 3 includes: a conductive wire portion 4 made of a conductor; and an insulating resin coating 5 which covers a peripheral surface of the conductive wire portion 4. The metal terminal 2 includes: a base portion 7 disposed on an outer end surface 6 side of the flange portion 1; and a receiving portion 9 extending from the base portion 7 by way of a bent portion 8 and receiving the end portion of the wire 3. The metal terminal 2 further includes: a welding portion 11 extending from the receiving portion 9 by way of a first folding portion 10 and welded to the conductive wire portion 4 of the wire 3; and a holding portion 13 extending from the receiving portion 9 by way of a second folding portion 12 and positioning the wire 3 by holding the wire 3.

With respect to the above-mentioned welding portion 11, a state of the welding portion 11 before a welding step is performed is shown in FIG. 9, and a state of the welding portion 11 after the welding step is performed is shown in FIG. 10. In FIG. 10, a melted ball 14 formed by welding is shown. The melted ball 14 is formed in such a manner that molten metal formed by welding is formed into a ball shape by surface tension, and the molten metal is solidified by being cooled while keeping a ball shape.

The detail of a step of connecting the wire 3 to the metal terminal 2 is described hereinafter. In a stage before such a connecting step is performed, in the metal terminal 2, the welding portion 11 and the holding portion 13 are in a state where the welding portion 11 and the holding portion 13 are opened with respect to the receiving portion 9 so that neither the welding portion 11 nor the holding portion 13 face the receiving portion 9. FIG. 9 shows a state where the welding portion 11 is opened with respect to the receiving portion 9 although the holding portion 13 faces the receiving portion 9.

Firstly, the wire 3 is placed on the receiving portion 9 of the metal terminal 2. To fix this state temporarily, the holding portion 13 is folded with respect to the receiving portion 9 by way of the second folding portion 12 such that the wire 3 is sandwiched between the receiving portion 9 and the holding portion 13.

Next, as shown in FIG. 9, a portion of the insulating resin coating 5 of the wire 3 disposed on a more distal end side than the holding portion 13 is removed. For example, a laser beam is irradiated to the insulating resin coating 5 for removing the insulating resin coating 5. As can be clearly understood from FIG. 9, a portion of the insulating resin coating 5 which is in contact with the receiving portion 9 is left without being removed.

Next, the welding portion 11 is folded with respect to the receiving portion 9 by way of the first folding portion 10 thus bringing about a state where the wire 3 is sandwiched between the welding portion 11 and the receiving portion 9.

Then, the conductive wire portion 4 of the wire 3 and the welding portion 11 are welded to each other. To be more specific, laser welding is applied. A laser beam is irradiated to the welding portion 11 so that the conductive wire portion 4 of the wire 3 and the welding portion 11 are melted to each other. A liquefied molten portion is formed into a ball shape by surface tension. Thereafter, the molten portion is solidified while keeping a ball shape so that the melt ball 14 is formed.

SUMMARY

In the technique described in the Japanese patent 4184394, to temporarily fix the wire 3 before welding is performed, it is necessary to bring about a state where the holding portion 13 faces the receiving portion 9 by bending the holding portion 13 by way of the second folding portion 12 thus bringing about a state where the wire 3 is sandwiched between the holding portion 13 and the receiving portion 9. However, such an operation gives rise to the following drawbacks.

Firstly, to enable the above-mentioned temporary fixing, it is necessary to provide the holding portion 13 to the metal terminal 2 separately from the welding portion 11. Accordingly, a shape of the metal terminal 2 becomes complicated and hence, there is a possibility that working for acquiring the metal terminal 2 becomes complicated.

In the step of connecting the wire 3 to the metal terminal 2, it is necessary to perform two bending workings, that is, bending working of the holding portion 13 by way of the second folding portion 12 and bending working of the welding portion 11 by way of the first folding portion 10 at different points of time. Accordingly, a manufacturing facility is required to possess devices which perform the above-mentioned two bending workings differently from each other.

The present disclosure has been made in view of such circumstances, and it is an object of the present disclosure to provide a method of manufacturing a coil component capable of overcoming the above-mentioned drawbacks.

According to a first aspect of the present disclosure, there is provided a method of manufacturing a coil component which includes: a wire having a conductive wire portion made of a conductor and an insulating resin coating which covers a peripheral surface of the conductive wire portion; and a metal terminal having a connecting portion which is electrically connected to the conductive wire portion.

To overcome the above-mentioned technical drawbacks, the method of manufacturing a coil component according to the present disclosure includes: a step of preparing, as the metal terminal, a metal terminal where the connecting portion has a receiving portion which receives the wire and a contact segment extending from the receiving portion by way of a bending scheduled portion; a thermocompression bonding step of applying heat and pressure in a state where the wire is placed on the receiving portion thus adhering the wire to the receiving portion using the molten or softened insulating resin coating as an adhesive agent; a contacting step of bending the connecting portion by way of the bending scheduled portion such that the contact segment faces the receiving portion by way of the wire and the contact segment is brought into contact with the wire; and a welding step of welding the wire and the metal terminal to each other by irradiating a laser beam to a portion of the metal terminal.

In the present disclosure, the above-mentioned thermocompression bonding step forms a step of temporarily fixing the wire before welding is performed.

In the present disclosure, the thermocompression bonding step may include a step of exposing the conductive wire portion from the insulating resin coating by removing a portion of the insulating resin coating positioned on a side opposite to a receiving portion side. In the thermocompression bonding step, heat is applied to the insulating resin coating. Accordingly, by making use of this heat, it is possible to expose the conductive wire portion from the insulating resin coating simultaneously with the thermocompression bonding step. By exposing the conductive wire portion from the insulating resin coating, it is possible to achieve a favorable welding state in the welding step performed later.

Alternatively, a step of exposing the conductive wire portion from the insulating resin coating may be further performed by irradiating a laser beam to the wire after the thermocompression bonding step is performed. With such a configuration, it is possible to expose the conductive wire portion from the insulating resin coating with more certainty. Also in this case, it is possible to achieve a favorable welding state in the welding step performed later. It is particularly effective to use a high heat resistant resin such as polyamideimide as the insulating resin coating because the conductive wire portion is minimally exposed from the insulating resin coating by thermocompression bonding.

According to the above-mentioned two operation modes, the state is provided where the conductive wire portion is exposed from the insulating resin coating in a stage where the contacting step is performed. Accordingly, in the contacting step, it is possible to easily acquire a state where the contact segment is brought into contact with the conductive wire portion exposed from the insulating resin coating. This advantageous effect also contributes to the acquisition of a favorable welding state in the welding step performed later.

In the present disclosure, it is preferable that the contacting step include a step of clamping the receiving portion and the contact segment of the metal terminal so as to bring the receiving portion and the contact segment into a close contact state. According to this clamping step, it is possible to bring a close contact state between the contact segment and the wire with certainty against a spring back phenomenon which is liable to occur at the time of bending the connecting portion of the metal terminal. This advantageous effect also contributes to the acquisition of a favorable welding state in the welding step performed later.

It is preferable that, in the welding step, a laser beam be irradiated to a surface of the contact segment on a side opposite to a surface of the contact segment which is adhered to the wire. With such a configuration, a melted ball which covers the whole periphery of the end portion of the wire is easily formed and hence, it is possible to acquire a highly reliable connection state between the wire and the metal terminal.

According to the present disclosure, in the thermocompression bonding step, the wire is temporarily fixed to the connecting portion of the metal terminal by applying heat and pressure in a state where the wire is placed on the receiving portion thus adhering the wire to the receiving portion using molten or softened insulating resin coating as an adhesive agent. Accordingly, it is unnecessary to form a portion having a shape similar to the holding portion 13 described in Japanese patent 4184394 (see FIG. 9 and FIG. 10) on the metal terminal.

Accordingly, as the bending working to be performed in connecting the wire to the metal terminal, it is sufficient to perform only the bending working in the contacting step where the connecting portion is bent by way of the bending scheduled portion such that the contact segment faces the receiving portion by way of the wire and the contact segment is brought into contact with the wire. Accordingly, the manufacturing facility can be simplified.

BRIEF DESCRIPTION OF THE DRAWINGS

FIG. 9 is a perspective view showing a flange portion 1 of a core provided to a coil component disclosed in Japanese patent 4184394, a metal terminal 2 disposed on the flange portion 1, and a wire 3 connected to the metal terminal 2, wherein FIG. 9 shows a state of these portions before a welding step is performed.

DETAILED DESCRIPTION

Figure 1:
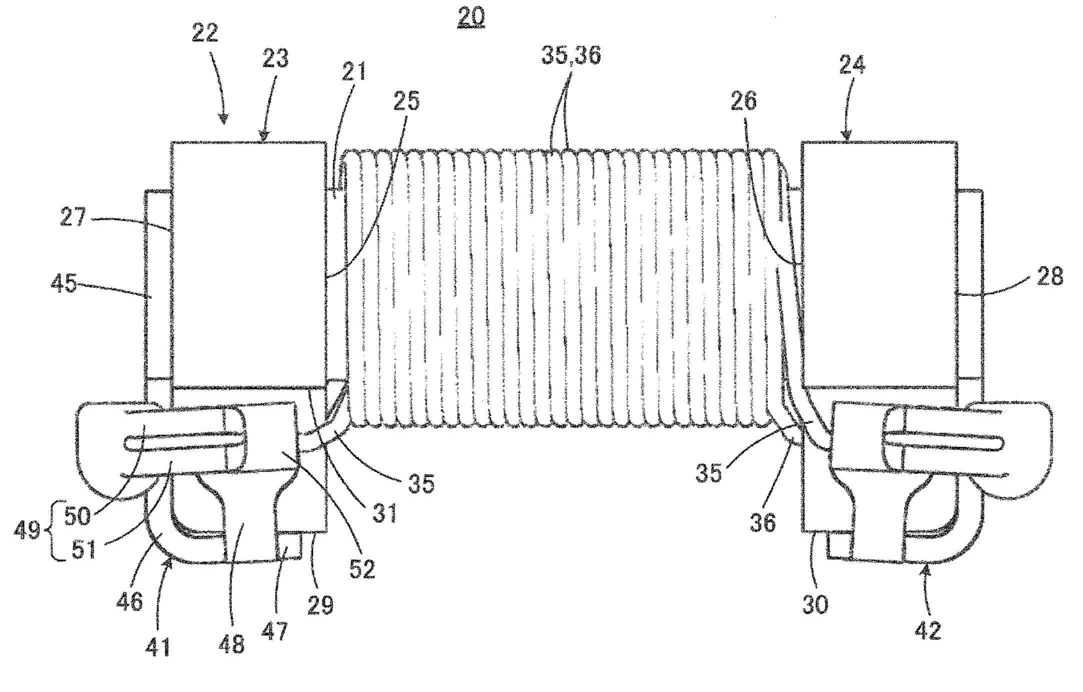
FIG. 1 is a front view showing an external appearance of one example of a coil component manufactured by a manufacturing method according to the present disclosure.
Figure 2:
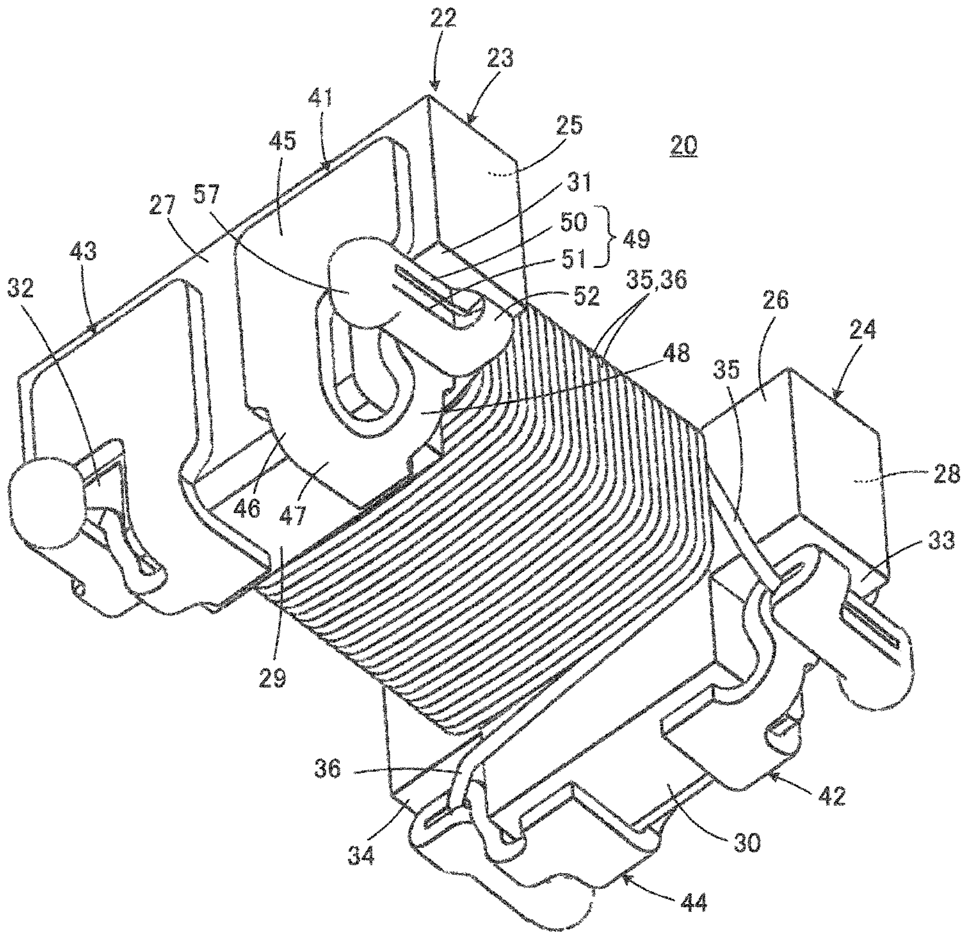
FIG. 2 is a perspective view showing a coil component 20 shown in FIG. 1 as viewed from a bottom surface side.
Figure 3:
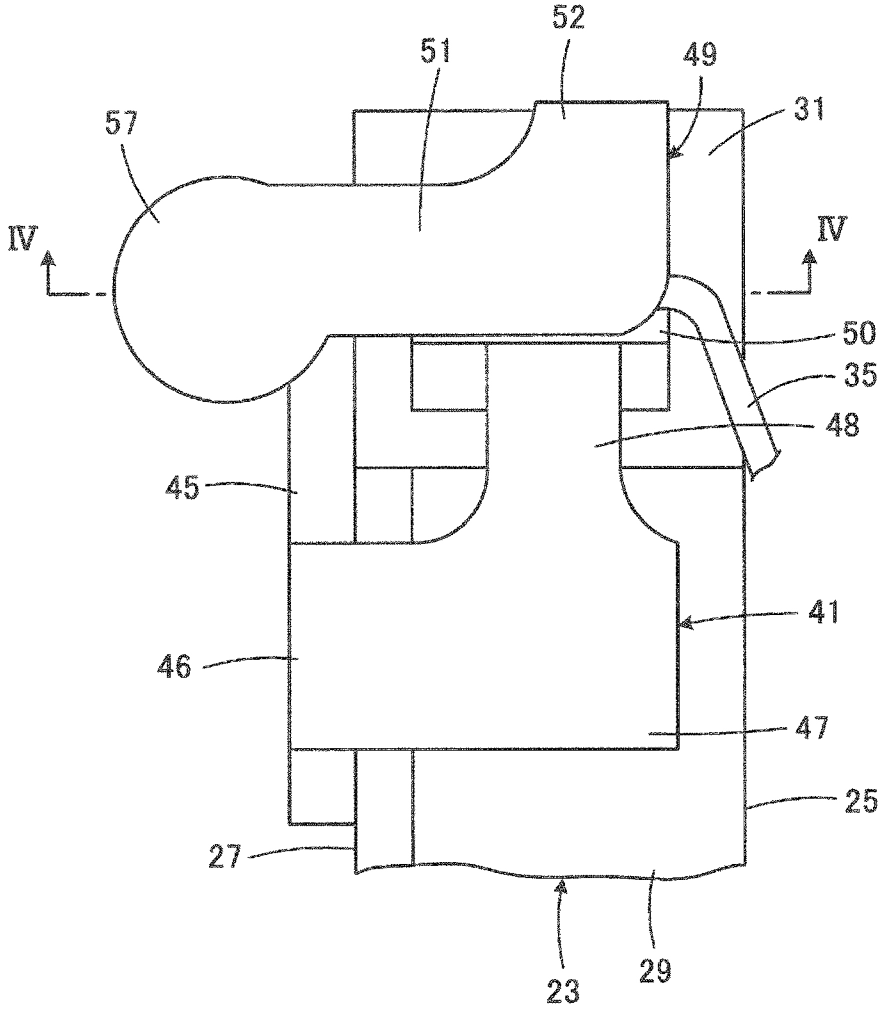
FIG. 3 is a bottom surface view showing a portion of the coil component 20 shown in FIG. 1 and FIG. 2, wherein a metal terminal 41, a portion of a flange portion 23 of a core on which the metal terminal 41 is disposed, and a wire 35 which is connected to the metal terminal 41 are shown.

The structure of a coil component 20 which is manufactured by a manufacturing method according to the present disclosure is described mainly with reference to FIG. 1 and FIG. 2. To be more specific, the coil component 20 shown in FIG. 1 and FIG. 2 forms a common mode choke coil as one example of a coil component.

The coil component 20 includes a core 22 having a winding core portion 21. The core 22 has a drum shape, and includes a first flange portion 23 and a second flange portion 24 which are formed on end portions of the winding core portion 21 respectively. The core 22 is made of a magnetic material such as ferrite, for example.

The flange portions 23, 24 respectively have: an inner end surface 25, 26 which faces a winding core portion 21 side and at which each end portion of the winding core portion 21 is positioned; and an outer end surface 27, 28 which faces the outside on a side opposite to the inner end surface 25, 26. Further, the flange portions 23, 24 respectively have a bottom surface 29, 30 which faces a printed circuit board (not shown in the drawing) side when the coil component 20 is actually mounted.

Recesses 31, 32 each having a cutout shape are formed on both end portions of the bottom surface 29 of the first flange portion 23 respectively. In the same manner, recesses 33, 34 each having a cutout shape are formed on both end portions of the bottom surface 30 of the second flange portion 24 respectively.

Figure 6:
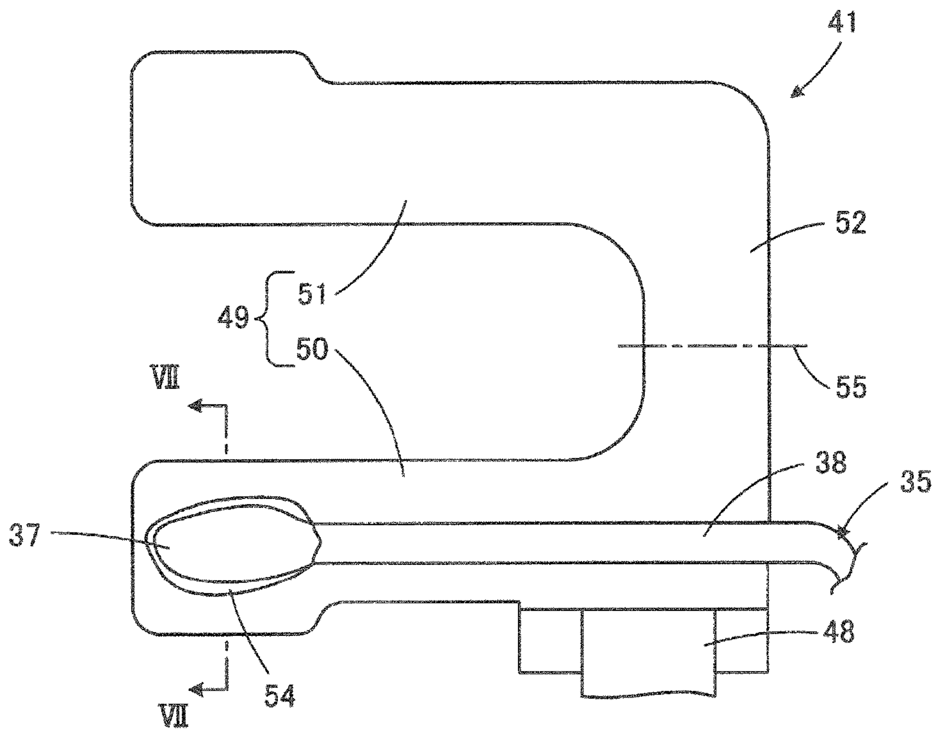
FIG. 6 is a view showing a state where the wire 35 is temporarily fixed to the receiving portion 50 of the metal terminal 41 shown in FIG. 5 by thermocompression bonding.
Figure 7:
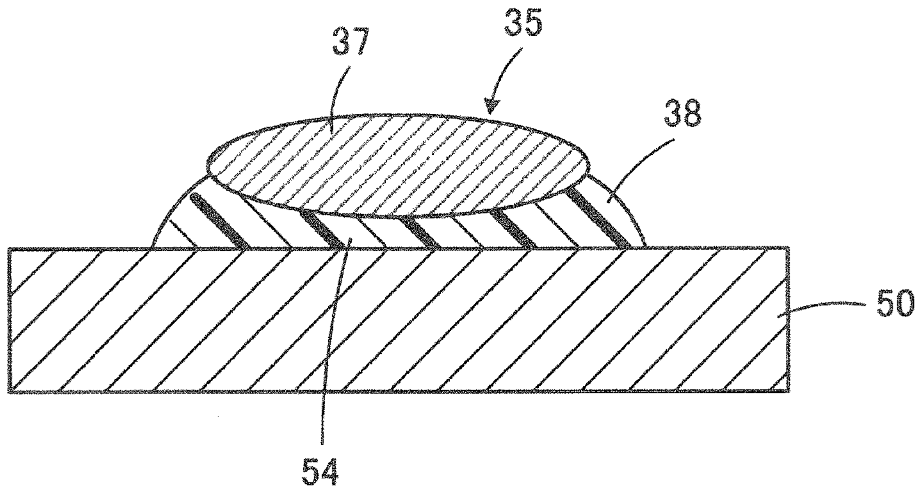
FIG. 7 is a cross-sectional view of a thermocompression bonded portion in FIG. 6 taken along line VII-VII in FIG. 6.

The coil component 20 further includes first and second wires 35, 36 which are spirally wound around the winding core portion 21. As shown in FIG. 6 and FIG. 7 described later, each of the wires 35, 36 has: a conductive wire portion 37 made of a conductor; and an insulating resin coating 38 which covers a periphery of the conductive wire portion 37. The conductive wire portion 37 is formed of a copper wire, for example. The insulating resin coating 38 is made of a resin such as polyurethane, polyimide, polyesterimide or polyamideimide, for example.

When the coil component 20 is a common mode choke coil, the wires 35, 36 are wound in the same direction. In this case, the wires 35, 36 may be wound in a double-layered manner such that either one of the wires is wound on an inner layer side, and the other wire is wound on an outer layer side, or may be wound by bifilar winding such that the wires are disposed alternately and parallel to each other in an axial direction of the winding core portion 21.

The coil component 20 further includes first to fourth metal terminals 41 to 44. Out of these first to fourth metal terminals 41 to 44, the first and third metal terminals 41, 43 are fixed to the first flange portion 23 by way of an adhesive agent. The second and fourth metal terminals 42, 44 are fixed to the second flange portion 24 by way of an adhesive agent.

The first metal terminal 41 and the fourth metal terminal 44 have the same shape, and the second metal terminal 42 and the third metal terminal 43 have the same shape. The first metal terminal 41 and the third metal terminal 43 have shapes which are in plane symmetry with each other, and the second metal terminal 42 and the fourth metal terminal 44 have shapes which are in plane symmetry with each other. Accordingly, the detailed description is made with respect to one of first to fourth metal terminals 41 to 44, for example, the first metal terminal 41, and the detailed description of the second, third and fourth metal terminals 42, 43 and 44 is omitted.

FIG. 3 to FIG. 8 show the metal terminal 41 or a portion of the metal terminal 41.

Usually, the metal terminal 41 is manufactured by applying sheet metal working to one metal sheet made of a copper-based alloy such as phosphor bronze or tough pitch copper, for example. However, the metal terminal 41 may be manufactured by other manufacturing methods such as casting, for example.

The metal terminal 41 includes: a base portion 45 extending along the outer end surface 27 of the flange portion 23; and a mounting portion 47 extending from the base portion 45 along the bottom surface 29 of the flange portion 23 by way of a first bent portion 46 which covers a ridge portion of the flange portion 23 where the outer end surface 27 and the bottom surface intersect with each other. When the coil component 20 is mounted on a printed circuit board not shown in the drawing, the mounting portion 47 forms a portion which is electrically and mechanically connected to a conductive land on the printed circuit board by soldering or the like.

The metal terminal 41 includes a connecting portion 49 extending from the mounting portion 47 by way of a second bent portion 48. Due to the formation of the second bent portion 48, the metal terminal 41 has an S-shaped bent shape. The connecting portion 49 has both a function of positioning the wire 35 by receiving the wire 35 and a function of electrically and mechanically connecting the wire 35 to the metal terminal 41.

To be more specific, the connecting portion 49 includes: a receiving portion 50 which receives the wire 35; and a contact segment 51 which extends by way of a joint portion 52 folded from the receiving portion 50 so as to overlap with the receiving portion 50 and is brought into contact with the wire 35 so as to position the wire 35 between the contact segment 51 and the receiving portion 50. The connecting portion 49 is positioned in the recess 31 formed on the first flange portion 23.

There may be a case where the reference symbols 45, 46, 47, 48, 49, 50, 51 and 52 used for indicating the base portion, the first bent portion, the mounting portion, the second bent portion, the connecting portion, the receiving portion, the contact segment and the joint portion of the above-mentioned first metal terminal 41 respectively are also used for indicating the base portions, the first bent portions, the mounting portions, the second bent portions, the connecting portions, the receiving portions, the contact segments, and the joint portions of the second, third and fourth metal terminals 42, 43 and 44 which correspond to the above-mentioned portions of the first metal terminal 41.

One end of the above-mentioned first wire 35 is connected to the first metal terminal 41, and the other end of the first wire 35 is connected to the second metal terminal 42. On the other hand, one end of the second wire 36 is connected to the third metal terminal 43, and the other end of the second wire 36 is connected to the fourth metal terminal 44. Hereinafter, steps of connecting the wires 35, 36 to the metal terminals 41 to which are characterizing steps included in the method of manufacturing the coil component 20 are described. In this specification, as a representative case, the steps of connecting the first wire 35 to the first metal terminal 41 is described.

Figure 5:
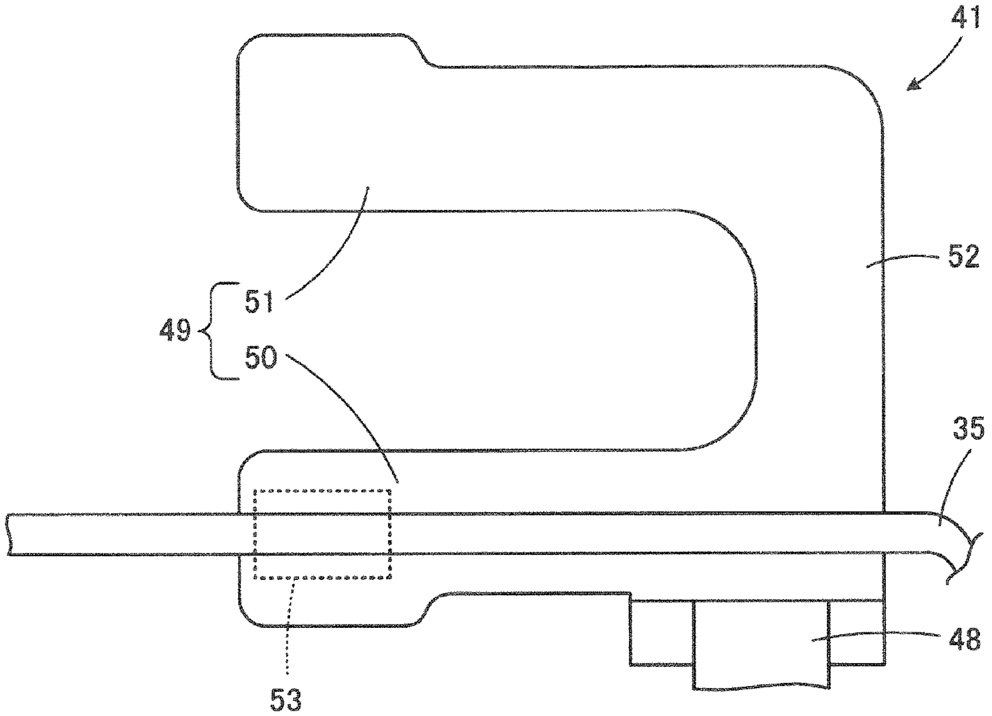
FIG. 5 is a view for describing a manufacturing method of the coil component according to one embodiment of the present disclosure, particularly, a step of connecting the metal terminal 41 and the wire 35 shown in FIG. 3 to each other, wherein a state where the wire 35 is disposed on a receiving portion 50 of the metal terminal 41 is shown.

In a stage before the wire 35 is connected to the first metal terminal 41, as shown in FIG. 5, the metal terminal 41 is in a state where the contact segment 51 is developed with respect to the receiving portion 50 in the connecting portion 49. While keeping this state, an end portion of the wire 35 wound around the winding core portion 21 is lead out onto the receiving portion 50 of the metal terminal 41 by a wire nozzle, and is positioned on the receiving portion 50.

Next, the wire 35 is temporarily fixed to the receiving portion 50. For this temporary fixing, a thermocompression bonding step is performed where heat and pressure are applied to the wire 35 in a state where the wire 35 is placed on the receiving portion 50. In the thermocompression bonding step, for example, a heater chip 53 which heats a region indicated by a dotted line in FIG. 5 is used. When the wire 35 on the receiving portion 50 is pressed while being heated by the heater chip 53, the insulating resin coating 38 is melted or softened. As a result, as shown in FIG. 6 and FIG. 7, a melted/softened material 54 derived from the insulating resin coating 38 functions as an adhesive agent so that the wire 35 is adhered to the receiving portion 50 by way of the melted/softened material 54. At this stage of operation, as a result of pressurizing in the thermocompression bonding step, the conductive wire portion 37 of the wire 35 is generally formed into a flat shape in cross section as shown in FIG. 7.

It is preferable that, as a result of the above-mentioned thermocompression bonding step, as shown in FIG. 7 clearly, the conductive wire portion 37 be brought into a state where a portion of the insulating resin coating 38 positioned on a side opposite to a receiving portion 50 side is removed so that the conductive wire portion 37 is exposed from the insulating resin coating 38. To acquire such a state where the conductive wire portion 37 is exposed from the insulating resin coating 38 in the thermocompression bonding step, for example, the thermocompression bonding step is performed under the following conditions.

First, as the heater chip 53, a heater chip having an area sufficient to cover the wire 35 and the receiving portion 50 is used, and a contact surface of the heater chip 53 is preferably a planar surface having a smooth surface. When the insulating resin coating 38 is made of polyamideimide, a temperature which falls within a range of from 400° C. to 550° C. inclusive is adopted as a thermocompression bonding temperature, and a thermocompression bonding time is set to 2 seconds or less. In this case, the insulating resin coating 38 is removed only at a portion where the heater chip 53 is brought into contact with the insulating resin coating 38. On the other hand, at portions of the insulating resin coating 38 where the heater chip 53 and the insulating resin coating 38 are not brought into contact with each other, melting of the insulating resin coating 38 due to the heat conduction is not completed so that the insulating resin coating 38 contributes to bonding between the wire 35 and the receiving portion 50 in a state where the insulating resin coating 38 remains in an incompletely melted state.

When the exposure of the conductive wire portion 37 from the insulating resin coating 38 is insufficient, the insulating resin coating 38 may be removed by irradiation of a laser beam, for example. The exposure of the conductive wire portion 37 from the insulating resin coating 38 is not always necessary, and succeeding steps may be performed in a state where the exposure of the conductive wire portion 37 from the insulating resin coating 38 is insufficient or in a state where there is no exposure of the conductive wire portion 37 from the insulating resin coating 38.

A portion of the wire 35 projecting from the receiving portion 50 is removed by cutting simultaneously with the above-mentioned thermocompression bonding step.

Figure 8:
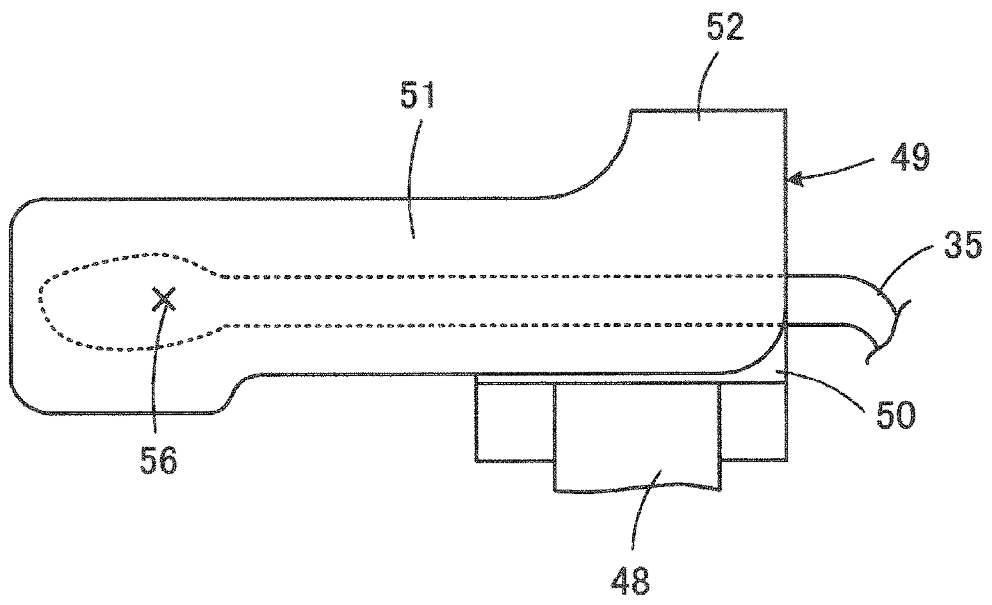
FIG. 8 is a view showing a state where a connecting portion 49 is bent such that a contact segment 51 overlaps with the receiving portion 50 after a step shown in FIG. 6 is performed, and the wire 35 is sandwiched between the receiving portion 50 and the contact segment 51.
Figure 9:
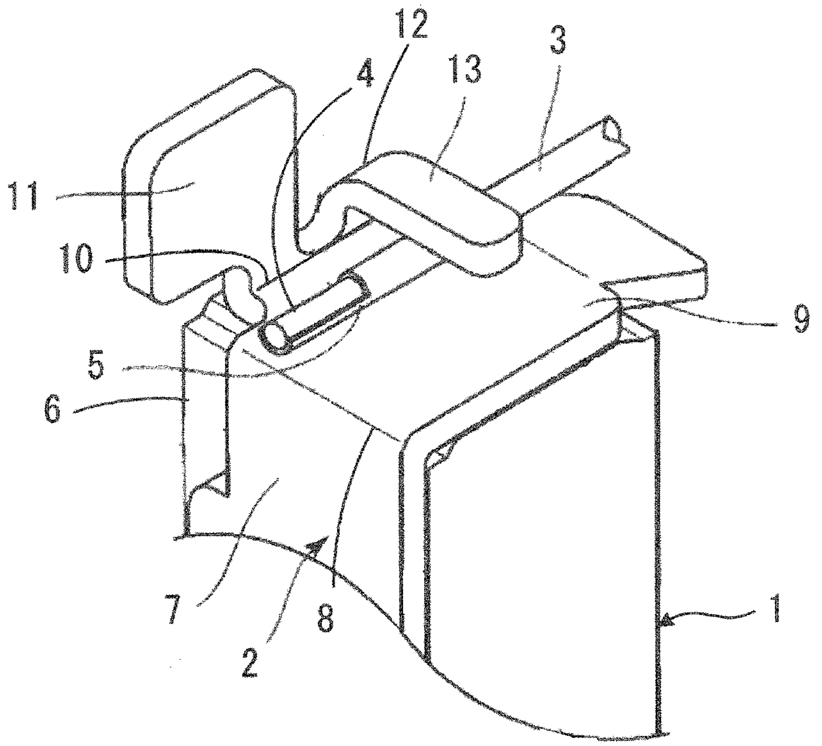
Figure 10:
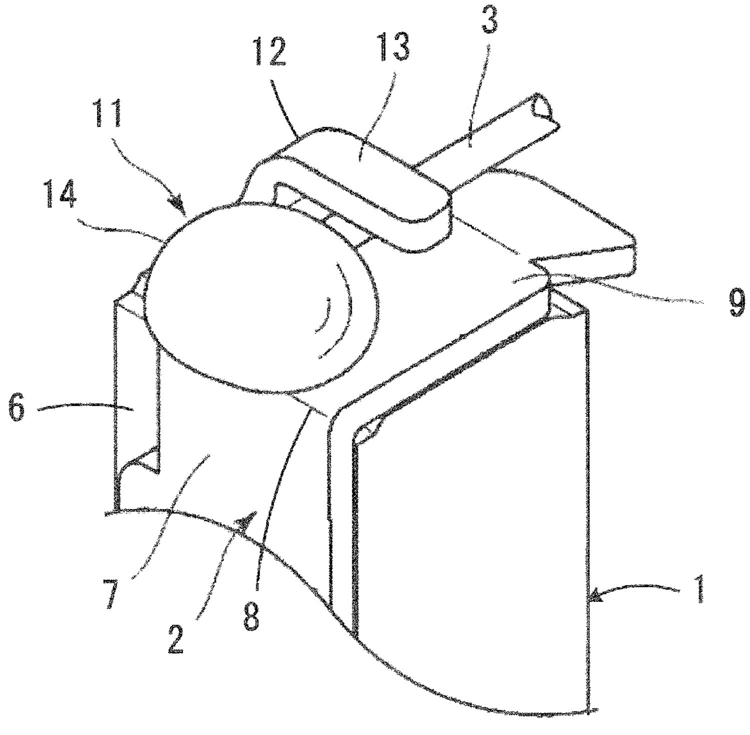
FIG. 10 is a perspective view showing a state of the portions shown in FIG. 9 after the welding step is performed.

Next, a contacting step is performed where the joint portion 52 is bent at a bending scheduled portion 55 indicated by a dotted chain line in FIG. 6. Due to such bending in the contacting step, as shown in FIG. 8, the contact segment 51 is brought into contact with the wire 35 and, at the same time, the contact segment 51 is made to overlap with the receiving portion 50 in a state where the contact segment 51 faces the receiving portion 50 with the wire 35 sandwiched therebetween. When the contact segment 51 is brought into contact with the wire 35, it is preferable that the contact segment 51 be brought into contact with the conductive wire portion 37 exposed from the insulating resin coating 38.

In the above-mentioned contacting step, in a state where a portion of the metal terminal 41 ranging from the base portion 45 to the mounting portion 47 is fixed, the contact segment 51 of the connecting portion 49 in a state shown in FIG. 6 is pushed up by a tool from a back side to a front side of a paper surface on which FIG. 6 is drawn so that, firstly, the metal terminal 41 is brought into a state where the contact segment 51 is bent by 90 degrees about the bending scheduled portion 55. Next, the tool is brought into contact with and is pressed to the contact segment 51 from a lateral side so that the contact segment 51 is bent at 90 degrees thus further bending the contact segment 51 by 90 degrees about the bending scheduled portion 55. With such operations, a state shown in FIG. 8 is obtained so that the contact segment 51 and the wire 35 are brought into contact with each other.

After the contact segment 51 and the wire 35 are brought into contact with each other as described above, preferably, a clamping step is performed so as to bring the receiving portion 50 and the contact segment 51 into close contact with each other. In the clamping step, it is preferable that the receiving portion 50 and the contact segment 51 be bonded to each other by pressure bonding in a state where a heater heated to 500° C., for example, is brought into pressure contact with the contact segment 51, and the wire 35 is sandwiched between the receiving portion 50 and the contact segment 51. According to this clamping step, it is possible to bring a close contact state between the contact segment 51 and the wire 35 with certainty against a spring back phenomenon which is liable to occur at the time of bending the connecting portion of the metal terminal 41. Further, the formation of gaps between the wire 35, the receiving portion 50 and the contact segment 51 can be substantially eliminated.

Next, a welding step is performed. In the welding step, it is preferable that a laser beam be irradiated to a surface of the contact segment 51 on a side opposite to a surface of the contact segment 51 which is adhered to the wire 35. In FIG. 8, a laser beam irradiation position 56 is shown. As one example, a laser beam having a wavelength of 1064 nm is irradiated for several milliseconds to a portion of the contact segment 51 displaced inward by 0.1 mm from a distal end of the contact segment 51.

Figure 4:
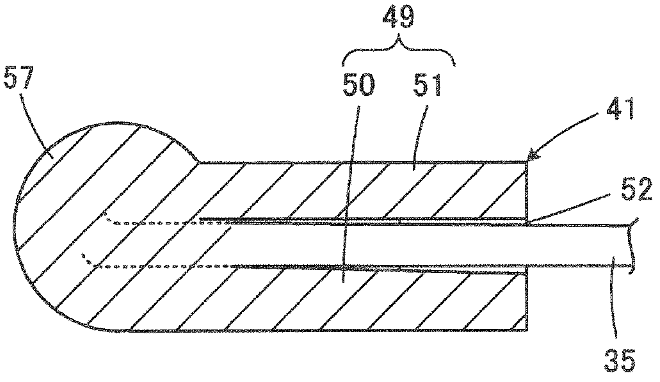
FIG. 4 is a cross-sectional view of the metal terminal 41 taken along line IV-IV in FIG. 3.

In the above-mentioned laser welding step, as shown in FIG. 4, the receiving portion 50 and the contact segment 51 are integrally formed with each other by way of a melted ball 57 at a position different from the joint portion 52. The melted ball 57 is formed by laser welding. In this embodiment, the receiving portion 50 and the contact segment 51 are integrally formed with each other by way of the melted ball 57 at respective distal end portions of the receiving portion 50 and the contact segment 51. Further, as shown in FIG. 4, it is possible to bring about a state where the whole periphery of the end portion of the wire 35 is covered by the melted ball 57. That is, the end portion of the wire 35 is positioned in the melted ball 57. The wire 35 has a small thickness at a boundary portion between a portion deformed by thermocompression bonding and a non-deformed portion so that the wire 35 is liable to be easily broken at the boundary portion. In view of the above, it is preferable that the whole portion of the wire 35 deformed by thermocompression bonding be enclosed in the melted ball 57. With such a configuration, the wire 35 has no thin portion so that the wire 35 is minimally broken.

Although the description has been made with respect to the connection between the first metal terminal 41 and the first wire 35, substantially the same steps are performed also with respect to the connections between other metal terminals 42 to 44 and the wire 35 or 36 so that the coil component 20 shown in FIG. 1 and FIG. 2 is completed.

Although the description has been made with respect to the coil component manufactured by the manufacturing method of the present disclosure based on the specific embodiment, the embodiment is merely described exemplarily, and various other modifications are conceivable.

For example, although not shown in FIG. 1 and FIG. 2, a plate-like core which extends between a pair of first and second flange portions 23, 24 may be provided in a state where a main surface of the core on one side is brought into contact with respective ceiling surfaces of the first and second flange portions 23, 24. In this case, when both a drum-shaped core 22 and the plate-like core are made of a magnetic material such as ferrite, a closed magnetic circuit is formed by the drum-shaped core 22 and the plate-like core.

The drum-shaped core 22 may be made of a non-magnetic material such as a resin, for example.

A coil component which is manufactured by the manufacturing method of the present disclosure may be a coil component having no core.

The number of wires which the coil component has and the number of metal terminals which the coil component has may be changed corresponding to a function of the coil component.

In the welding step, a laser beam may be irradiated to a surface of the contact segment 51 other than the surface of the contact segment 51 on a side opposite to the surface of the contact segment 51 which is adhered to the wire 35. For example, a laser beam may be irradiated to a surface of the receiving portion 50 which is adhered to the wire 35.

What is claimed is:

1. A method of manufacturing a coil component which includes: a wire having a conductive wire portion made of a conductor and an insulating resin coating which covers a peripheral surface of the conductive wire portion; and a metal terminal having a connecting portion which is electrically connected to the conductive wire portion, the method comprising:

preparing the metal terminal wherein the connecting portion of the metal terminal has a receiving portion which receives the wire and a contact segment extending from the receiving portion via a bending scheduled portion;

a thermocompression bonding step of applying heat and pressure in a state where the wire is placed on the receiving portion, and adhering the wire to the receiving portion by melting or softening the insulating resin coating for use as an adhesive agent;

a contacting step of bending the connecting portion at the bending scheduled portion such that the contact segment faces the receiving portion via the wire and the contact segment is brought into contact with the wire; and welding the wire and the metal terminal to each other by irradiating a laser beam to a portion of the metal terminal such that the entire receiving portion in the thickness direction and the entire contact segment in the thickness direction are integrally formed with each other at respective distal end portions of the receiving portion and the contact segment, and the whole periphery of the end portion of the wire is covered by a melted ball.

2. The method of manufacturing a coil component according to claim 1, wherein the thermocompression bonding step includes a step of exposing the conductive wire portion from the insulating resin coating by removing a portion of the insulating resin coating located on a side opposite to a receiving portion side.

3. The method of manufacturing a coil component according to claim 1 further comprising exposing the conductive wire portion from the insulating resin coating by irradiating a laser beam to the wire after the thermocompression bonding step is performed.

4. The method of manufacturing a coil component according to claim 2, wherein, in the contacting step, the contact segment is brought into contact with the conductive wire portion exposed from the insulating resin coating.

5. The method of manufacturing a coil component according to claim 1, wherein the contacting step includes a step of clamping the receiving portion and the contact segment of the metal terminal so as to bring the receiving portion and the contact segment into a close contact state.

6. The method of manufacturing a coil component according to claim 1, wherein, in the welding step, a laser beam is irradiated to a surface of the contact segment on a side opposite to a surface of the contact segment which is adhered to the wire.

* * * * *